United States Patent [19]

Drukaroff et al.

[11] 3,969,751

[45] July 13, 1976

[54] LIGHT SHIELD FOR A SEMICONDUCTOR DEVICE COMPRISING BLACKENED PHOTORESIST

[75] Inventors: Israel Drukaroff, Lakewood; Wally Morren, Somerville, both of N.J.

[73] Assignee: RCA Corporation, New York, N.Y.

[22] Filed: Dec. 18, 1974

[21] Appl. No.: 533,995

[52] U.S. Cl. .................................... 357/30; 357/32; 357/54
[51] Int. Cl.² .................... H01L 27/14; H01L 31/00
[58] Field of Search ............... 357/19, 30, 45, 32; 340/173 LM

[56] References Cited
UNITED STATES PATENTS

| | | | |
|---|---|---|---|
| 3,535,469 | 10/1970 | Miller | 357/17 |
| 3,569,997 | 3/1971 | Lehovec | 357/30 |
| 3,581,161 | 5/1971 | Cunningham et al. | 357/71 |
| 3,609,475 | 9/1971 | Kaposhilin | 357/17 |
| 3,622,419 | 11/1971 | London et al. | 357/30 |
| 3,748,546 | 7/1973 | Allison | 357/45 |
| 3,771,149 | 11/1973 | Collins et al. | 357/24 |
| 3,801,880 | 4/1974 | Harada et al. | 357/40 |
| 3,821,616 | 6/9174 | Kravitz | 357/45 |

Primary Examiner—William D. Larkins
Assistant Examiner—Gene M. Munson
Attorney, Agent, or Firm—H. Christoffersen; Robert P. Williams; Thomas H. Magee

[57] ABSTRACT

A light shield for selectively shielding light-sensitive elements in a semiconductor device from incident light comprises an opaque layer of material which is substantially nonreflective to light such as, for example, blackened photoresist, blackened metal, or a plastic containing particles of black carbon.

4 Claims, 1 Drawing Figure

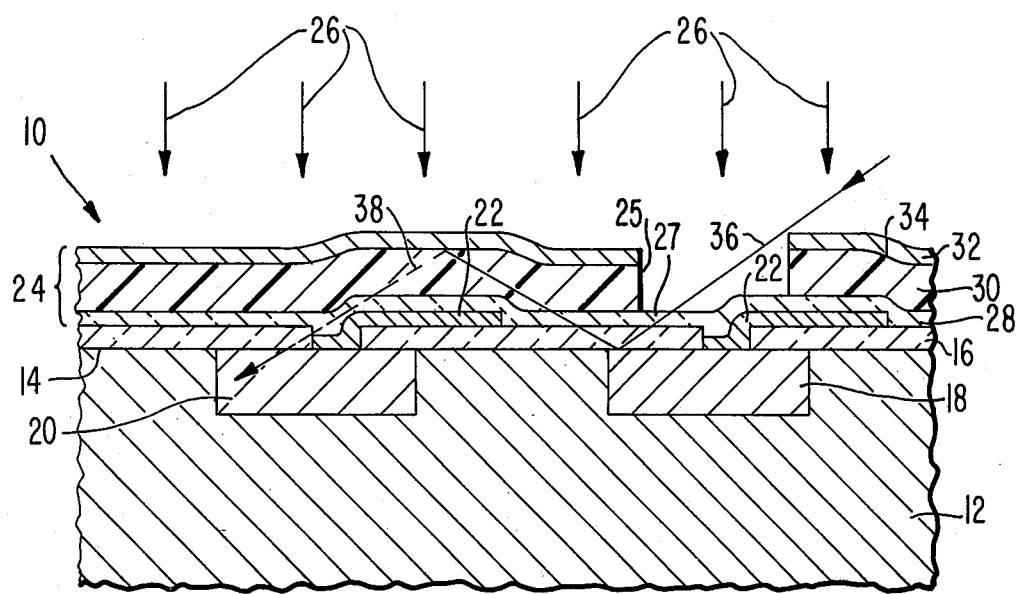

LIGHT SHIELD FOR A SEMICONDUCTOR DEVICE COMPRISING BLACKENED PHOTORESIST

This invention relates to an opaque light shield for selectively shielding light-sensitive elements disposed in a semiconductor device from incident light.

A semiconductor device frequently comprises light-sensitive elements such as, for example, PN junctions disposed in a semiconductor substrate. In such a device it is often desired to selectively expose some of the light-sensitive elements to light incident upon the device while shielding the other elements. For example, the light-sensitive elements desired to be exposed to the incident light may typically comprise light-sensitive diodes which are utilized to sense an optical signal, such as in a solid state camera, whereas the elements desired to be shielded from such light are the associated circuit elements such as, for example, metal oxide semiconductor (MOS) circuit elements which are utilized to process the "sensed" signal. If such processing circuitry is not properly shielded from the light, the light-sensitive portions thereof such as, for example, source and drain regions may give false signals which degrade the desired output of the device. In order to selectively shield some of the light-sensitive elements, a light shield comprising a layer of opaque material is often disposed on a surface of the substrate. The light shield has openings therein adjacent to the light-sensitive elements which are desired to be exposed to the incident light. In such a device the opaque material shields the elements desired to be shielded from direct rays of incident light while the openings allow the desired elements to be exposed to the incident light.

Even though some of the light-sensitive elements are shielded from direct rays of incident light, these elements are often exposed to oblique rays of incident light which pass through the openings in the light shield and may then be internally reflected upon such elements after multiple internal reflections involving the unexposed surface of the opaque light shield. Such a phenomenon may be described as a "skipping" effect and results in exposing to such reflected light the light-sensitive elements which are desired to be shielded from the incident light.

It is also desirable to minimize the number of processing steps in making such a light shield.

In the drawing:

The single FIGURE is a cross-sectional view illustrating a light-sensitive semiconductor device having disposed thereon the preferred embodiment of the present invention.

Referring to the drawing, there is illustrated a semiconductor device 10 comprising a semiconductor substrate 12 of silicon, for example, which has a surface 14 thereof covered with a light-transmitting layer 16 of insulating material such as, for example, silicon dioxide, and which has disposed therein, adjacent to the surface 14, first and second light-sensitive elements 18 and 20, respectively, which are diagrammatically shown. Elements 18 and 20 may be simple regions defining photosensitive PN junctions with the remainder of the substrate 12 or they may be more complex photosensitive elements. In any case, deposited conductors 22 may be provided to connect the elements to other circuit elements or to each other. Such conductors 22 are diagrammatically illustrated in the drawing.

A light-shielding structure 24 is disposed above the surface 14 of the substrate 12 and has a window 25 therein adjacent to the first light-sensitive element 18. The window 25 of the light-shielding structure 24 exposes the first light-sensitive element 18 to incident light, shown by arrows 26 in the drawing, while the light-shielding structure 24 shields the second light-sensitive element 20 from the incident light. Although a portion 27 of the light-shielding structure 24 is within the window 25 area, such portion 27 consists of light-transmitting material such as, for example, silicon dioxide.

The light-shielding structure 24 shown in the drawing comprises a layer 28 of silicon dioxide disposed adjacent to the conductors 22 and insulating layer 16, a layer 30 of plastic such as, for example, polyimide disposed on the layer 28 of silicon dioxide, and an opaque layer 32 having, adjacent to the layer 30 of plastic, a surface 34 thereof substantially nonreflective to light. The opaque layer 32 comprises, preferably, a blackened photoresist or blackened metal layer having the property of absorbing substantially all light striking a surface thereof, which makes the opaque layer 32 substantially nonreflective to light throughout including the surface 34 thereof adjacent the layer 30 of plastic. Since the opaque layer 32, practically speaking, will not absorb absolutely one hundred percent of the light striking a surface thereof, the surface 34 will actually reflect a small amount of light. The use of the word "substantially" is intended to reflect this reality, and the use of the phrase "substantially nonreflective to light" means that a slight amount of reflection is within the concept of this invention and that such reflectivity would not be of a sufficient amount to affect the shielded elements and cause false signals which degrade the desired output of the device 10. The opaque layer 32 may also comprise a layer of plastic such as, for example, polyimide which contains particles of black carbon throughout. A polyimide which works well in the present invention is Pyralin PI-1200 which is available commercially from E. I. du Pont de Nemours and Co., Wilmington, Del. The layer 28 of silicon dioxide protects the conductors 22 of the semiconductor device from being contaminated and/or oxidized during treatment, i.e., a blackening process in the preferred embodiment, which makes the opaque layer 32 substantially nonreflective to light. The layer 30 of plastic not only acts as a spacer to reduce undesirable capacitive coupling between the circuitry of the device 10, including the conductors 22, and overlying metal including the opaque layer 32 when such layer 32 comprises blackened metal, but also provides excellent adherence between the silicon dioxide layer 28 and the opaque layer 32 when the opaque layer 32 comprises blackened photoresist.

Although the preferred embodiment of the light-shielding structure 24 includes a layer 28 of silicon dioxide and a layer 30 of plastic, the light-shielding structure 24 of the present invention may comprise just the opaque layer 32 of substantially nonreflective material upon the layer 30 of plastic disposed directly adjacent to the conductors 22 and insulating layer 16, or may comprise simply the opaque layer 32 of substantially nonreflective material, when such material is nonconductive, disposed directly adjacent to the conductors 22 and insulating layer 16. The layer 28 of silicon dioxide may be omitted when it is unnecessary to protect the conductors 22 from being contaminated and/or oxidized during the treatment used to make the layer 32 nonreflective, for example, where such treatment comprises depositing particles of black carbon throughout the layer 32. The layer 30 of plastic may be omitted when it is necessary to have neither a spacer between the circuitry of the device 10 and overlying metal nor to have a layer between the silicon dioxide layer 28 and the opaque layer 32 for providing adherence between these two layers, for example, when the opaque layer 32 comprises blackened photoresist.

The present novel method of making the light-shielding structure 24 begins with the step of forming on the conductors 22 and insulating layer 16 the layer 28 of silicon dioxide using any conventional deposition technique. A typical silicon dioxide deposition technique is to react a gaseous silane such as, for example, silicon tetrahydride ($SiH_4$) with oxygen in the presence of an inert gas such as, for example, nitrogen while maintaining the temperature of the substrate 12 at about 350°C.

The layer 30 of plastic is then formed on the layer 28 of silicon dioxide. A coating comprising a polymerizable chemical which is capable of hardening to a plastic, in the present example a polyimide resin solution, is applied, preferably, by using a photoresist whirler capable of 4000 r.p.m. The solution may comprise, for example, 12–18% of the resin by weight in dimethyl acetamide. The thickness of the layer 30 which is applied by this spin-coating method depends largely on the concentration of the resin solution and also on the speed of the whirler. Usually the more concentrated the solution, the thicker the layer which is applied by this method. After the coating is applied, it is preferably dried at about 80°C for approximately 3 minutes to drive off the solvent.

The opaque layer 32 is now formed on the layer of polyimide, this opaque layer 32 being, preferably, blackened photoresist. A layer of photoresist, in this example a positive-working photoresist, is deposited on the layer of polyimide, the photoresist being selected from the group of photoresists having the property of becoming opaque and substantially nonreflective to light after being heated in air at approximately 300°C. Most conventional photoresists have this property, and one example is the AZ-1350 photoresists marketed by the Shipley Company, Newton, Massachusetts. The photoresist is applied preferably by flooding the surface of the polyimide layer with the photoresist solution and whirling at about 4000 r.p.m. for approximately 20 seconds. The photoresist layer is then baked at approximately 180°F for about 15 minutes.

The window 25 of the light-shielding structure 24 is now formed in the photoresist layer and the polyimide layer. A positive masking pattern, not shown, is placed on top of the photoresist layer and the pattern is exposed, using ultraviolet light, for a few seconds. After exposure is complete, the photoresist is developed using a conventional developing solution such as, for example, the AZ developer marketed by the Shipley Company, Newton, Massachusetts, and this step removes the portion of the photoresist layer which was exposed to ultraviolet light. The polyimide material of the layer 30 is also soluble in this developer so that this step also removes the portion of the polyimide layer directly beneath the removed portion of the photoresist layer. The portion of the silicon dioxide layer 28 which was adjacent to the removed portion of the polyimide layer is now exposed by the window 25 formed in the photoresist and polyimide portion of the light-shielding structure 24.

The photoresist layer is then exposed to treatment which makes the layer both opaque and substantially non-reflective to light. Preferably, the substrate 12 is heated in an oxidizing ambient such as air at a temperature of about 300°C, for example, until the layer of photoresist becomes opaque and substantially nonreflective to light. The layer 28 of silicon dioxide protects the conductors 22 of the semiconductor device 10 from being contaminated and/or oxidized during this blackening-bake step of the process.

The opaque layer 32 may also be blackened metal. In a typical process the silicon dioxide layer 28 is first formed on the conductors 22 and insulating layer 16 followed by the plastic layer 30 using steps similar to those described above. The opaque layer 32 is now formed on the layer 30 of plastic, the material of this layer 32 being an opaque metal selected from the group of metals having the property of becoming substantially nonreflective to light after being exposed to appropriate treatment. For example, a layer of copper may be deposited upon the plastic layer 30. After forming the window 25 in the copper and plastic portion of the light-shielding structure 24 using conventional photolithographic processes, the copper layer is chemically reacted with a polysulfide until the layer becomes black and substantially nonreflective to light. The opaque layer 32 may also comprise a layer of aluminum which becomes substantially nonreflective to light after being exposed to a typical anodizing process which makes the layer 32 substantially black.

The opaque layer 32 may also be formed by depositing above the substrate 12 a layer of plastic such as, for example, polyimide containing particles of black carbon throughout. Preferably, a black carbon powder is mixed throughout a polyimide and then a layer of the carbon-containing polyimide is formed on the conductors 22 and insulating layer 16. The particles of black carbon make such a layer of polyimide opaque and substantially nonreflective to light.

The plastic layer 30 provides spacing between overlying metal, including the opaque layer 32 when such layer 32 comprises blackened metal, and the circuitry of the device 10 including the conductors 22, which reduces undesirable capacitance effects often encountered between underlying and overlying areas, particularly at high operating frequencies. Another advantage of having the plastic layer 30 is that it provides, during and after the high-temperature blackening-bake step of the process, excellent adherence between the silicon dioxide layer 28 and the opaque layer 32 when the opaque layer 32 comprises blackened photoresist. Where economy is an important consideration, and with appropriate selection of the material of the opaque layer 32, one or both of the intervening layers of silicon dioxide 28 and plastic 30 may be left out of the light-shielding structure.

Since a photoresist processing step is generally used at some point in the fabrication of a semiconductor device, the utilization of such a layer of photoresist as a light shield for the device saves processing steps and thereby achieves economies in production. The use of blackened metal is desirable for the opaque and substantially nonreflective material in very demanding applications since the light transmission through the metal layer is infinitesimally close to zero, which is superior to the result obtained using the layer of blackened photoresist. Also, the metal layer can be grounded and thereby act as an internal electrostatic shield for the semiconductor device. Such shielding may be desirable for high efficiency operation of the device when used at high frequencies.

The drawing diagrammatically shows the reflected path of an oblique ray 36 of incident light which passes through the window 25 in the light-shielding structure 24. The oblique ray 36 strikes the first light-sensitive element 18 and is then internally reflected towards the substantially nonreflective surface 34 of the opaque layer 32. This surface 34 prevents such light ray 36 from being internally reflected by the opaque layer 32 upon the second light-sensitive element 20. The dotted segment 38 of the light ray 36 represents a typical reflected path which the light ray 36 is prevented from taking by making the surface 34 of the opaque layer 32 substantially nonreflective to light. As a result, the second light-sensitive element 14 is protected from not only transmitted but also internally reflected incident light.

What is claimed is:

1. A semiconductor device comprising:

a semiconductor substrate having first and second light-sensitive elements disposed therein, and
   a light-shielding structure comprising a layer of opaque material, disposed above a surface of said substrate and having a window therein adjacent to said first lightsensitive element, said window exposing said first lightsensitive element to light incident upon said device and said light-shielding structure shielding said second lightsensitive element from said incident light, said opaque layer being blackened photoresist having the property of absorbing substantially all light striking a surface thereof.

2. A semiconductor device as defined in claim 1 wherein said light-shielding structure further comprises a layer of plastic disposed between said opaque layer and said substrate.

3. A semiconductor device as defined in claim 2 wherein said layer of plastic comprises a polyimide.

4. A semiconductor device as defined in claim 2, wherein said light-shielding structure further comprises a layer of silicon dioxide disposed between said layer of plastic and said substrate.

* * * * *